United States Patent
Goto et al.

(10) Patent No.: US 7,713,635 B2
(45) Date of Patent: May 11, 2010

(54) COPPER OXIDE THIN FILM LOW-FRICTION MATERIAL AND FILM-FORMING METHOD THEREFOR

(75) Inventors: Masahiro Goto, Tsukuba (JP); Akira Kasahara, Tsukuba (JP); Masahiro Tosa, Tsukuba (JP); Kazuhiro Yoshihara, Tsukuba (JP)

(73) Assignee: National Institute for Materials Science, Tsukuba-shi (JP)

( * ) Notice: Subject to any disclaimer, the term of this patent is extended or adjusted under 35 U.S.C. 154(b) by 933 days.

(21) Appl. No.: 10/554,204

(22) PCT Filed: Apr. 23, 2004

(86) PCT No.: PCT/JP2004/005902

§ 371 (c)(1), (2), (4) Date: Dec. 13, 2005

(87) PCT Pub. No.: WO2004/094687

PCT Pub. Date: Nov. 4, 2004

(65) Prior Publication Data

US 2008/0113219 A1   May 15, 2008

(30) Foreign Application Priority Data

Apr. 24, 2003   (JP) ............................. 2003-120461

(51) Int. Cl.
B32B 9/00 (2006.01)
H05H 1/24 (2006.01)
(52) U.S. Cl. ...................... 428/469; 428/472; 428/702; 427/453; 427/576
(58) Field of Classification Search ...................... None
See application file for complete search history.

(56) References Cited

FOREIGN PATENT DOCUMENTS

| JP | 2003-119578 | * | 4/2003 |
|---|---|---|---|
| JP | 2003-277912 | | 10/2003 |

OTHER PUBLICATIONS

Goto, et al., "Lubricative Coatings of Copper Oxide for Aerospace Application," J. Appl. Phys., 94(3), Aug. 1, 2003.*

* cited by examiner

Primary Examiner—Timothy M Speer
(74) Attorney, Agent, or Firm—Wenderoth, Lind & Ponack, L.L.P.

(57) ABSTRACT

A copper oxide thin film mainly containing CuO is formed by a plasma film-forming process on a substrate for film formation. The friction coefficient of the copper oxide thin film can be controlled remarkably low.

9 Claims, 5 Drawing Sheets

COPPER OXIDE THIN FILM LOW-FRICTION MATERIAL AND FILM-FORMING METHOD THEREFOR

TECHNICAL FIELD

The invention of the present application relates to a copper oxide thin film low-friction material and a method of forming the film. In particular, the invention of the present application relates to a copper oxide thin film low-friction material having a friction coefficient in the atmosphere or under ultra-high vacuum controlled to a small value, and a method of forming the film.

BACKGROUND ART

Mechanical parts for the turbines revolving at a high speed under a high-temperature, high-humidity condition and the apparatuses and devices driven in an extreme environment such as the driving devices in space station should be made of a material lower in friction, and such environments cause problems of oxidation of the parts due to exposure to the high-temperature high-humidity condition and increase of the friction coefficient of the parts due to collision of atomic oxygen to the parts (oxidative degradation).

Use of an oxide-based low-friction material may be a possible way to overcome the problems above, but there is actually, almost no such oxide material available.

For example, copper oxide, which is prepared from a cheap raw material and easier in handling, has a high friction coefficient of approximately 0.2 or more in the atmosphere and in vacuum even if it is formed by surface oxidation, and thus, it is considered to be difficult to use it as a low-friction material. Actually, the friction coefficients thereof so far reported are larger at 1.6 in the atmosphere and 0.4 in vacuum (J. R. Whitehead, Proc. Roy. Soc A210 (1850) 109).

However, a low-friction oxide thin film material, if made available, can be prepared from an extremely cheap raw material and is free from the concern about the increase in friction coefficient due to oxidation because it is already oxidized, and thus would be used favorably in various fields including the power generation and aerospace fields.

An object of the invention of the present application, which was made under the circumstances above, is to provide a new technical means of facilitating formation of a thin film having a low friction coefficient.

DISCLOSURE OF INVENTION

To solve the problems above, the invention of the present application provides first a method of forming a copper oxide thin film low-friction material, characterized by forming a copper oxide thin film mainly containing CuO on a substrate for deposition, in vacuum by plasma deposition.

The invention of the present application also provides secondly the method of forming a copper oxide thin film low-friction material above, wherein the copper oxide thin film is formed while a mixed gas of a rare gas and oxygen is introduced; thirdly the film-forming method above wherein the crystal in the copper oxide thin film is oriented; and fourthly the film-forming method above wherein the copper oxide thin film is formed by plasma sputtering.

The invention of the present application also provides fifthly a copper oxide thin film low-friction material formed on a substrate, characterized by containing mainly CuO in the composition and having friction coefficients of 0.06 or less both in the atmosphere and in vacuum at $3 \times 10^{-5}$ Pa; sixthly, the copper oxide thin film low-friction material above, wherein the copper oxide thin film is formed by plasma deposition; seventhly the copper oxide thin film low-friction material above, wherein the crystal of the copper oxide thin film is oriented; and eighthly a sliding device, characterized by having a sliding face coated with the copper oxide thin film low-friction material above.

Although copper oxide had attracted no attention as a low-friction material because it has a large friction coefficient in the atmosphere and in vacuum, the inventors of the present application have studied in detail on the relationship of the friction property thereof with the change in the composition of three components, CuO, $Cu_2O$, and Cu, during plasma deposition and with the change in structural factors such as the direction of crystal growth and the crystallinity determined by X-Ray structural analysis. The invention of the present application is completed on the basis of the findings obtained from the results by such detailed studies. The invention of the present application provides a copper oxide thin film having a low friction coefficient that cannot be expected at all from conventional knowledge and experience. Noteworthy is that it is possible to obtain a copper oxide thin film having an extremely low-level friction coefficient of, for example, 0.06 or less, both in the atmosphere and in ultra-high vacuum environment such as aerospace. The copper oxide thin film having such a low friction coefficient is extremely useful as a coating agent for use on the sliding face of precision devices, aerospace-related devices, and the like. In addition, the invention of the present application also enables adjustment of various properties such as electrical and optical properties as well as the friction property.

BEST MODE FOR CARRYING OUT THE INVENTION

Figure 1:
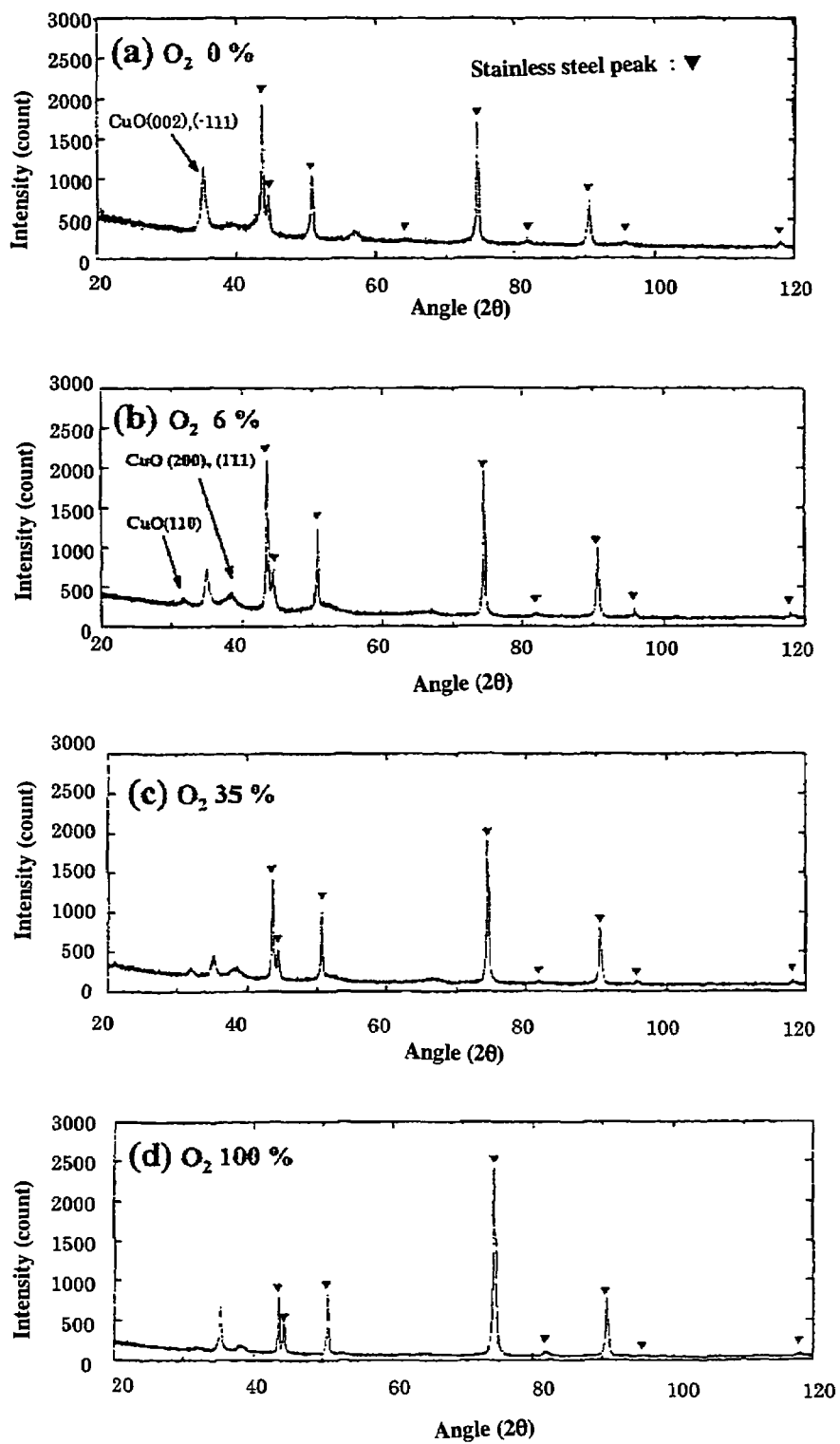
FIG. 1 shows X-Ray diffraction spectra obtained at different oxygen concentrations.

Favorable embodiments of the invention of the present application, which is characterized above, will be described below.

By the invention of the present application, i.e., a method of forming a copper oxide thin film, a copper oxide thin film mainly containing CuO is formed on a substrate for deposition, by gas-phase plasma deposition.

The plasma deposition is performed by a so-called low-temperature plasma deposition method under reduced pressure (vacuum) such as sputtering (sputter) or ion plating, which is known and commonly practiced in the art, and more specifically such as magnetron sputter, high-frequency excitation ion plating, or the like. When an evaporation source material is used, it may be evaporated, for example, by resistance heating or ion beam irradiation. Alternatively, a laser ablation method may be used.

For example, in the method of forming a copper oxide thin film according to the invention of the present application, the copper oxide thin film is formed in vacuum by employing the plasma deposition method described above. The degree of vacuum then is considered to be normally in the range of $1 \times 10^{-3}$ to $1 \times 10^{-8}$ Pa and more favorably $1 \times 10^{-4}$ to $1 \times 10^{-6}$ Pa.

After a vacuum chamber for plasma deposition is deaerated to the degree of vacuum above, plasma is discharged for plasma deposition, while a rare gas or a mixed gas of a rare gas and oxygen is introduced into the chamber. The operation conditions during the plasma deposition, such as the degree of vacuum, the concentration of oxygen in the mixed gas, the intensity of RF (radiofrequency wave) for generation of plasma, the distance between substrate and target, and the strength of the substrate, are determined suitably for efficient plasma deposition of the copper oxide thin film mainly containing CuO. More favorably, these conditions are selected to make the copper oxide thin film formed have a friction coefficient of not higher than 0.1 in the atmosphere and in vacuum. A friction coefficient of 0.1 or more is undesirable, in particular from the viewpoint of the friction coefficient in vacuum.

The oxygen concentration may be 0%, that is, only a rare gas may be used, but the oxygen concentration is preferably, for example, in the range of 3 to 20% as partial pressure, because the copper oxide thin film thus obtained has friction coefficients of 0.06 or less both in the atmosphere and in vacuum, in particular under an indicator vacuum of $1 \times 10^{-5}$ Pa, and the difference between the friction coefficients above is smaller, as will be described in the Examples below.

The copper oxide thin film according to the invention of the present application, which has a significantly low friction coefficient, contains mainly CuO in its composition. The film may contain $Cu_2O$ and Cu additionally, but preferably contains CuO in an amount of 90 mole % or more; and more preferably, the film is substantially made only of CuO in composition. Characteristically, the CuO thin film according to the invention of the present application has an anisotropic crystal structure and a higher tendency to orient itself on the substrate.

The rare gas introduced into the vacuum chamber together with an oxygen gas may be argon, helium, xenon, krypton, or the like.

In addition, the substrate according to the invention of the present application may be any of conductors, insulators, and semiconductors, and the shape thereof may also be flat plate, curved plate, irregular-surfaced irregular-shaped plate, or the like.

A typical favorable example of the method is a plasma sputter method, and, for example, CuO is then used as the target.

The invention of the present application, which is characterized as described above, will be described more specifically with reference to Example hereinafter, but it should be understood that the invention is not restricted by the following Example.

In the invention of the present application and also in the description of the following Examples, the friction coefficient is measured according to the known method described in M. Goto et al., J. VAc. Sci. Technol. A20 (4) (2002) 1453.

EXAMPLE

Magnetron sputter deposition was performed on the mirror-surfaced surface of an SUS304 stainless steel substrate commonly used (surface roughness: about 40 nm) by using CuO as a target. The conditions then were as follows:

Sputter target: CuO: 99.9% purity

Vacuum: $1 \times 10^{-5}$ Pa

RF power: 100 W

Substrate temperature: 300 K

Pre-sputtering period: 5 minutes

Sputtering period: 30 minutes

Copper oxide thin films were formed under the conditions above, while the content of oxygen in the mixed gas of argon and oxygen was altered in the range of 0 to 100% as partial pressure.

Figure 2:
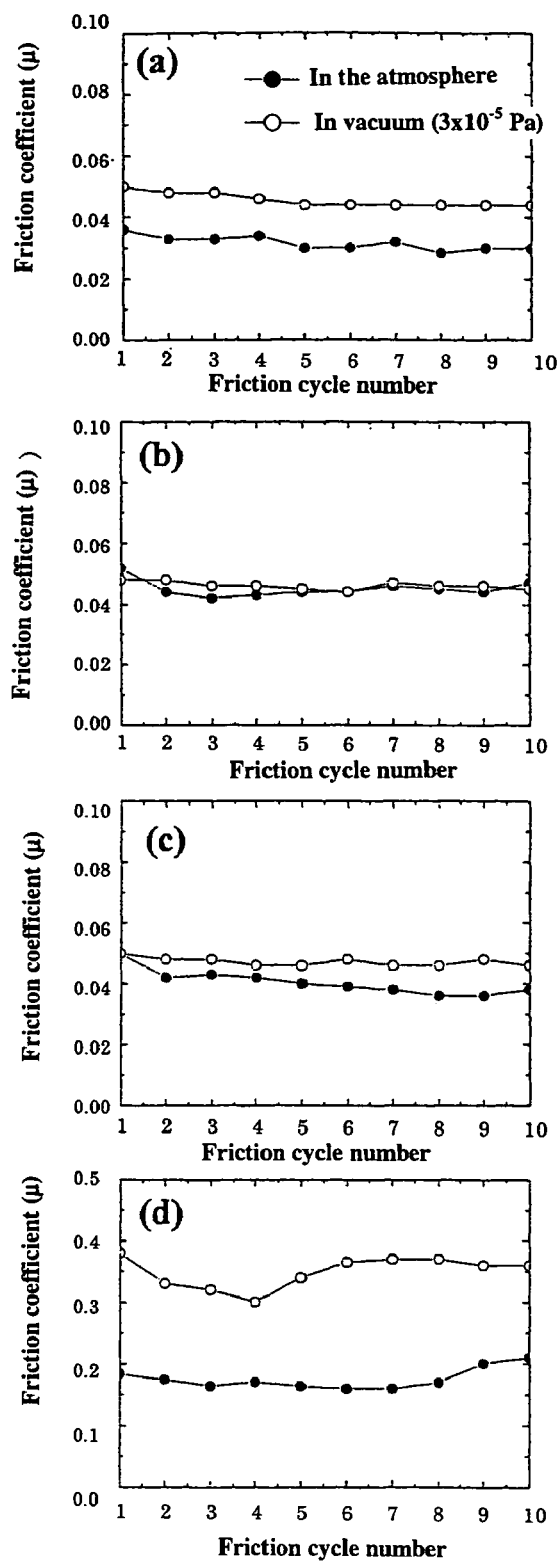
FIG. 2 includes charts exemplifying the change of the friction coefficient of a copper oxide thin film in the atmosphere and under ultra-high vacuum when a stainless steel indenter is used.
Figure 3:
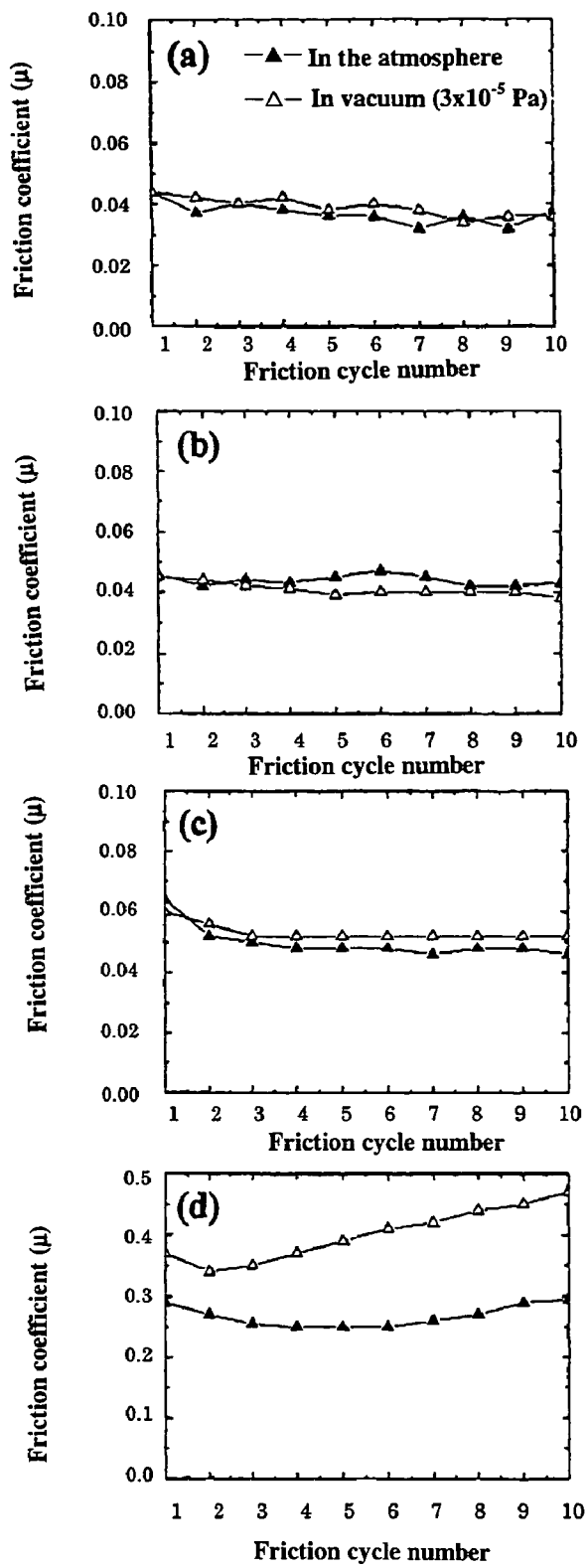
FIG. 3 includes charts exemplifying the change of the friction coefficient of a copper oxide thin film in the atmosphere and under ultra-high vacuum when a sapphire indenter is used.

FIG. 1 exemplifies X-Ray diffraction spectra of the thin films obtained when the oxygen concentrations (partial pressure %) were respectively (a) 0%, (b) 6%, (c) 35%, and (d) 100%. FIGS. 2 and 3 exemplify the change in the friction coefficients of a copper oxide thin film in the atmosphere and under ultra-high vacuum, respectively when a stainless steel indenter and a sapphire indenter were used. The vacuum shown in the figures ($3 \times 10^{-5}$ Pa) is the vacuum when the friction coefficient was determined.

As apparent from FIGS. 1, 2, and 3, the crystal structure of CuO varies according to the oxygen concentration, and it is possible to obtain a drastically lower friction coefficient, depending on the degree of the anisotropy in the orientation of the film generated on the substrate.

Figure 4:
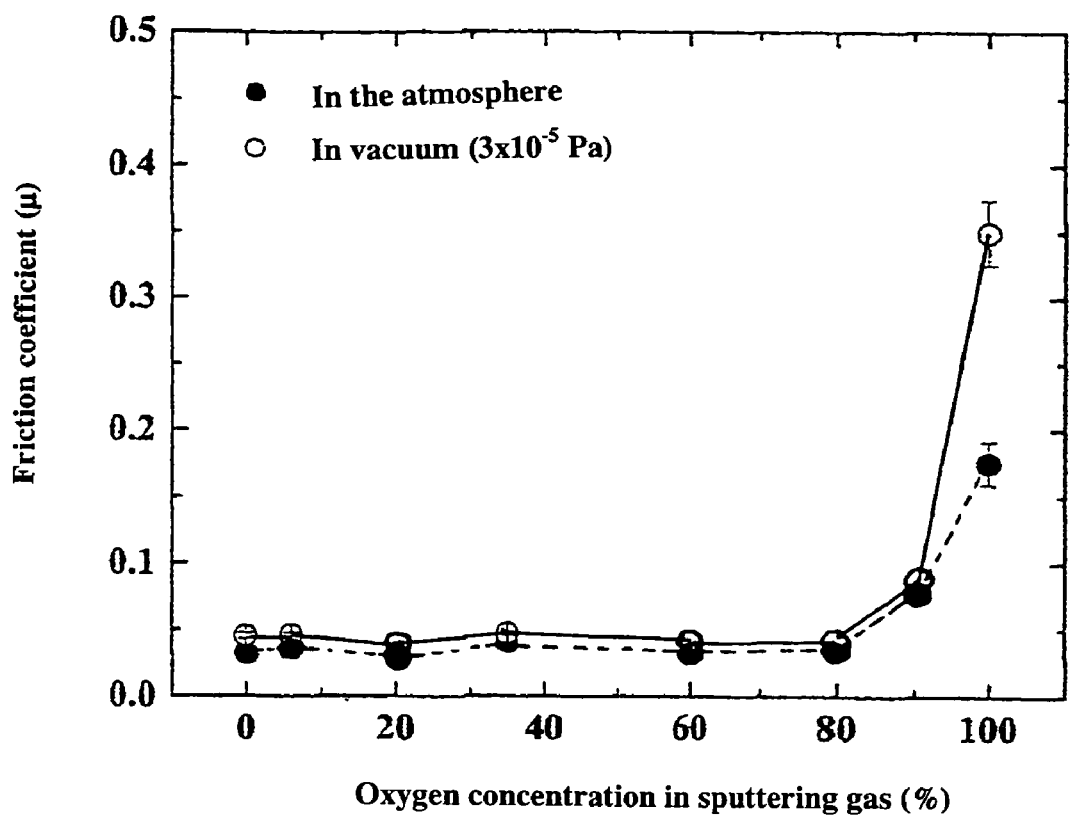
FIG. 4 is a chart exemplifying the change of the average friction coefficient as determined in ten friction cycle tests by using a stainless steel indenter, as a function of oxygen concentration.
Figure 5:
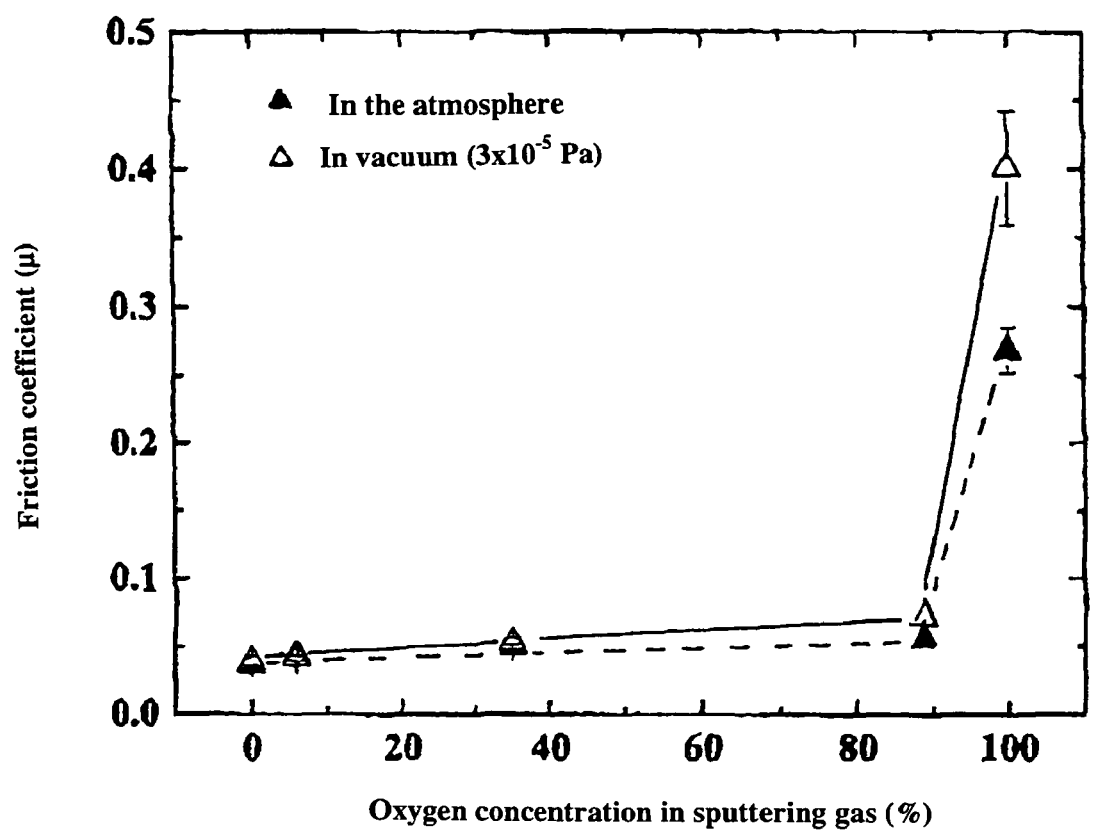
FIG. 5 is a chart exemplifying the change of the average friction coefficient as determined in ten friction cycle tests by using a sapphire indenter, as a function of oxygen concentration.

FIGS. 4 and 5 exemplify the relationship between the average friction coefficient in ten friction cycle tests and the $O_2$ concentration in the sputtering gas ($Ar+O_2$), respectively as determined by using a stainless steel indenter and a sapphire indenter. The vacuum shown in the figures ($3 \times 10^{-5}$ Pa) is the vacuum when the friction coefficient was determined.

As apparent from FIGS. 4 and 5, the friction coefficients were 0.06 or less both in the atmosphere and in vacuum at $1 \times 10^{-5}$ Pa, at an $O_2$ gas partial pressure of 85% or less, and there is almost no difference between the friction coefficients in the atmosphere and in vacuum, particularly at an oxygen partial pressure in the range of 3 to 20%.

INDUSTRIAL APPLICABILITY

As described above in detail, the invention of the present application provides a method of forming a copper oxide thin film having a friction coefficient controlled to an extremely small value.

The method of forming a copper oxide thin film according to the invention of the present application provides for the first time a copper oxide thin film having a small friction coefficient in the atmosphere and under ultra-high vacuum and allows control of the friction coefficient at will by changing the composition and the structure of the copper oxide thin film formed. Therefore, it would be effective in producing a coating material for use, for example, on turbines, vacuum breakers, and aerospatial driving materials in the power generation field as well as on aerospatial parts. In addition, the copper oxide thin film according to the invention of the present application, which is resistant to the increase in friction coefficient due to oxidation, can be used as a longer-lasting low-friction material, and it is also possible to form multiple copper oxide thin films different in friction coefficient according to applications, and for that reason, there is an intense need for commercialization thereof as a coating material.

The invention claimed is:

1. A method of forming a copper oxide thin film low-friction material containing CuO mainly in its composition and having friction coefficients of 0.06 or less both in the atmosphere and in vacuum at $3\times10^{-5}$ Pa, which comprises forming the copper oxide thin film low-friction material on a substrate for deposition, by plasma sputtering in vacuum at $1\times10^{-4}$ to $1\times10^{-6}$ Pa, while using CuO as a target and introducing a mixed gas of a rare gas and oxygen containing oxygen at a partial pressure of 85% or less.

2. The film-forming method according to claim 1, wherein the crystal of the copper oxide thin film is oriented.

3. A copper oxide thin film low-friction material formed on a substrate, containing mainly CuO in its composition and having friction coefficients of 0.06 or less both in the atmosphere and in vacuum at $3\times10^{-5}$ Pa.

4. The copper oxide thin film low-friction material according to claim 3, formed by plasma deposition.

5. The copper oxide thin film low-friction material according to claim 3, wherein the crystal of the copper oxide thin film is oriented.

6. The copper oxide thin film low-friction material according to claim 4, wherein the crystal of the copper oxide thin film is oriented.

7. A sliding device, having a sliding face coated with the copper oxide thin film low-friction material according to claim 3.

8. A sliding device, having a sliding face coated with the copper oxide thin film low-friction material according to claim 4.

9. A sliding device, having a sliding face coated with the copper oxide thin film low-friction material according to claim 5.

* * * * *